(12) United States Patent
Hoshi et al.

(10) Patent No.: US 12,293,945 B2
(45) Date of Patent: May 6, 2025

(54) SEMICONDUCTOR CHIP AND METHOD FOR MANUFACTURING THE SAME

(71) Applicants: DENSO CORPORATION, Kariya (JP); TOYOTA JIDOSHA KABUSHIKI KAISHA, Toyota (JP); MIRISE Technologies Corporation, Nisshin (JP); National University Corporation Tokai National Higher Education and Research System, Nagoya (JP); HAMAMATSU PHOTONICS K.K., Hamamatsu (JP)

(72) Inventors: Shinichi Hoshi, Nisshin (JP); Masatake Nagaya, Nisshin (JP); Chiaki Sasaoka, Nagoya (JP); Daisuke Kawaguchi, Hamamatsu (JP); Keisuke Hara, Hamamatsu (JP)

(73) Assignees: DENSO CORPORATION, Kariya (JP); TOYOTA JIDOSHA KABUSHIKI KAISHA, Toyota (JP); MIRISE Technologies Corporation, Nisshin (JP); National University Corporation Tokai National Higher Education and Research System, Nagoya (JP); HAMMATSU PHOTONICS K.K., Hamamatsu (JP)

( * ) Notice: Subject to any disclaimer, the term of this patent is extended or adjusted under 35 U.S.C. 154(b) by 396 days.

(21) Appl. No.: 17/708,490

(22) Filed: Mar. 30, 2022

(65) Prior Publication Data
US 2022/0352027 A1    Nov. 3, 2022

(30) Foreign Application Priority Data

Apr. 29, 2021    (JP) .................... 2021-076935

(51) Int. Cl.
*H01L 21/78* (2006.01)
*H01L 21/02* (2006.01)
(Continued)

(52) U.S. Cl.
CPC .... *H01L 21/7813* (2013.01); *H01L 21/02389* (2013.01); *H01L 21/0254* (2013.01); *H10D 30/475* (2025.01); *H10D 62/8503* (2025.01)

(58) Field of Classification Search
CPC .......... H01L 21/7813; H01L 21/02389; H01L 21/0254; H01L 21/2003
See application file for complete search history.

(56) References Cited

U.S. PATENT DOCUMENTS

| | | | | |
|---|---|---|---|---|
| 6,039,889 A | * | 3/2000 | Zhang | .................... H05K 3/427 |
| | | | | 216/13 |
| 6,225,651 B1 | * | 5/2001 | Billon | ............... H01L 21/76898 |
| | | | | 257/190 |

(Continued)

FOREIGN PATENT DOCUMENTS

JP    2013-243275 A    12/2013

OTHER PUBLICATIONS

Chu et al., "Study of GaN light-emitting diodes fabricated by laser lift-off technique", Journal of Applied Physics, vol. 95, No. 8, Apr. 2004, pp. 3916-3922.

*Primary Examiner* — Mark W Tornow
(74) *Attorney, Agent, or Firm* — Posz Law Group, PLC

(57) ABSTRACT

A semiconductor chip includes a chip constituent substrate having a first surface and a second surface, and including a layer containing gallium nitride. The chip constituent substrate is provided with a semiconductor element, and components constituting the semiconductor element are located more in an area adjacent to the first surface than in an area adjacent to the second surface. The chip constituent sub-
(Continued)

strate is formed with a through hole penetrating the chip constituent substrate from the first surface to the second surface. The through hole defines a first opening adjacent to the first surface and a second opening adjacent to the second surface, and the first opening is larger than the second opening.

9 Claims, 12 Drawing Sheets

(51) Int. Cl.
    *H10D 30/47*     (2025.01)
    *H10D 62/85*     (2025.01)

(56) References Cited

U.S. PATENT DOCUMENTS

| | | |
|---|---|---|
| 8,158,514 B2 * | 4/2012 | Kruger .............. H01L 21/76898 |
| | | 438/597 |
| 2018/0240902 A1 | 8/2018 | Odnoblyudov et al. |
| 2020/0098634 A1 | 3/2020 | Tsunami |
| 2020/0180082 A1 | 6/2020 | Tanaka et al. |
| 2020/0212213 A1 | 7/2020 | Odnoblyudov et al. |
| 2020/0212214 A1 | 7/2020 | Odnoblyudov et al. |
| 2022/0181236 A1 * | 6/2022 | Okamoto .......... H01L 29/41708 |
| 2022/0254632 A1 * | 8/2022 | Wang .................. H10D 30/475 |

* cited by examiner

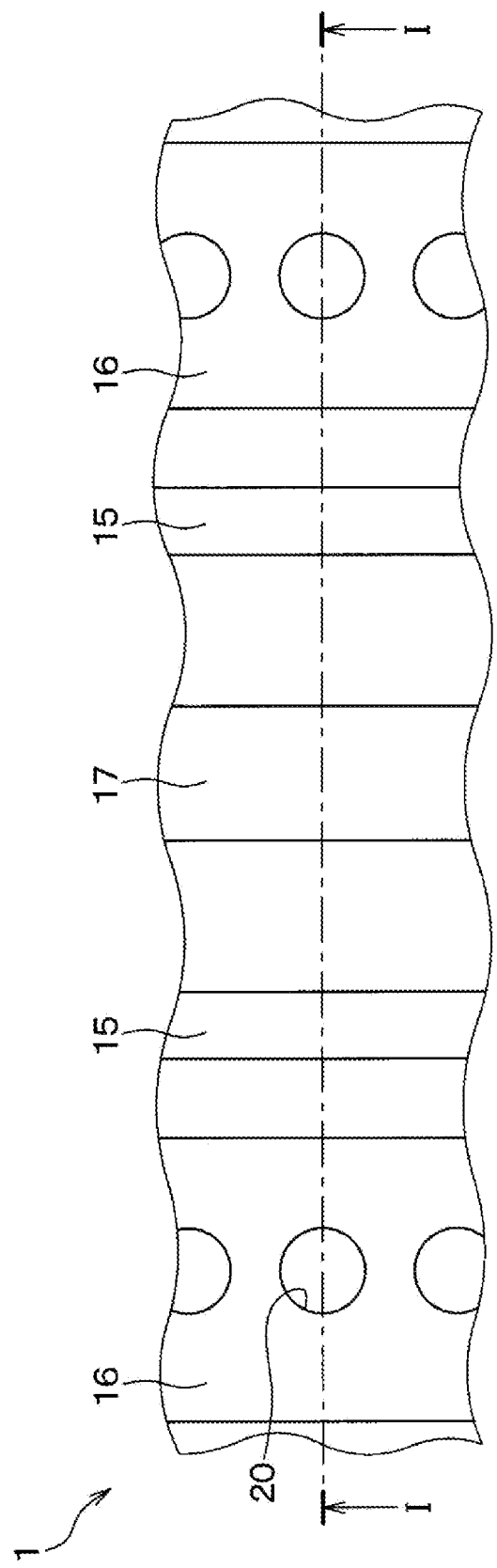

SEMICONDUCTOR CHIP AND METHOD FOR MANUFACTURING THE SAME

CROSS REFERENCE TO RELATED APPLICATION

The present application claims the benefit of priority from Japanese Patent Application No. 2021-76935 filed on Apr. 29, 2021. The entire disclosures of the above application are incorporated herein by reference.

TECHNICAL FIELD

The present disclosure relates to a semiconductor chip containing gallium nitride (hereinafter, also simply referred to as GaN), and a method for manufacturing the same.

BACKGROUND

For example, a method for dividing a GaN ingot into two ingots has been proposed. In such a method, specifically, a GaN ingot is firstly prepared. Next, by irradiating an inside of the GaN ingot with a laser beam, a transformation layer in which gallium and nitrogen are separated is formed inside the GaN ingot. Then, the GaN ingot is divided into two ingots at the transformation layer as a starting point of the division.

SUMMARY

The present disclosure describes a semiconductor chip capable of suppressing distortion and a method for manufacturing the same. According to an aspect of the present disclosure, a semiconductor chip includes a chip constituent substrate having a first surface and a second surface, and including a layer containing gallium nitride. The chip constituent substrate is provided with a semiconductor element, and components constituting the semiconductor element are located more in an area adjacent to the first surface than in an area adjacent to the second surface. The chip constituent substrate is formed with a through hole penetrating the chip constituent substrate from the first surface to the second surface. The through hole defines a first opening adjacent to the first surface and a second opening adjacent to the second surface, and the first opening is larger than the second opening.

BRIEF DESCRIPTION OF THE DRAWINGS

Objects, features and advantages of the present disclosure will become more apparent from the following detailed description made with reference to the accompanying drawings, in which:

FIG. 2 is a plan view of the semiconductor chip shown in FIG. 1;

DETAILED DESCRIPTION

Figure 1:
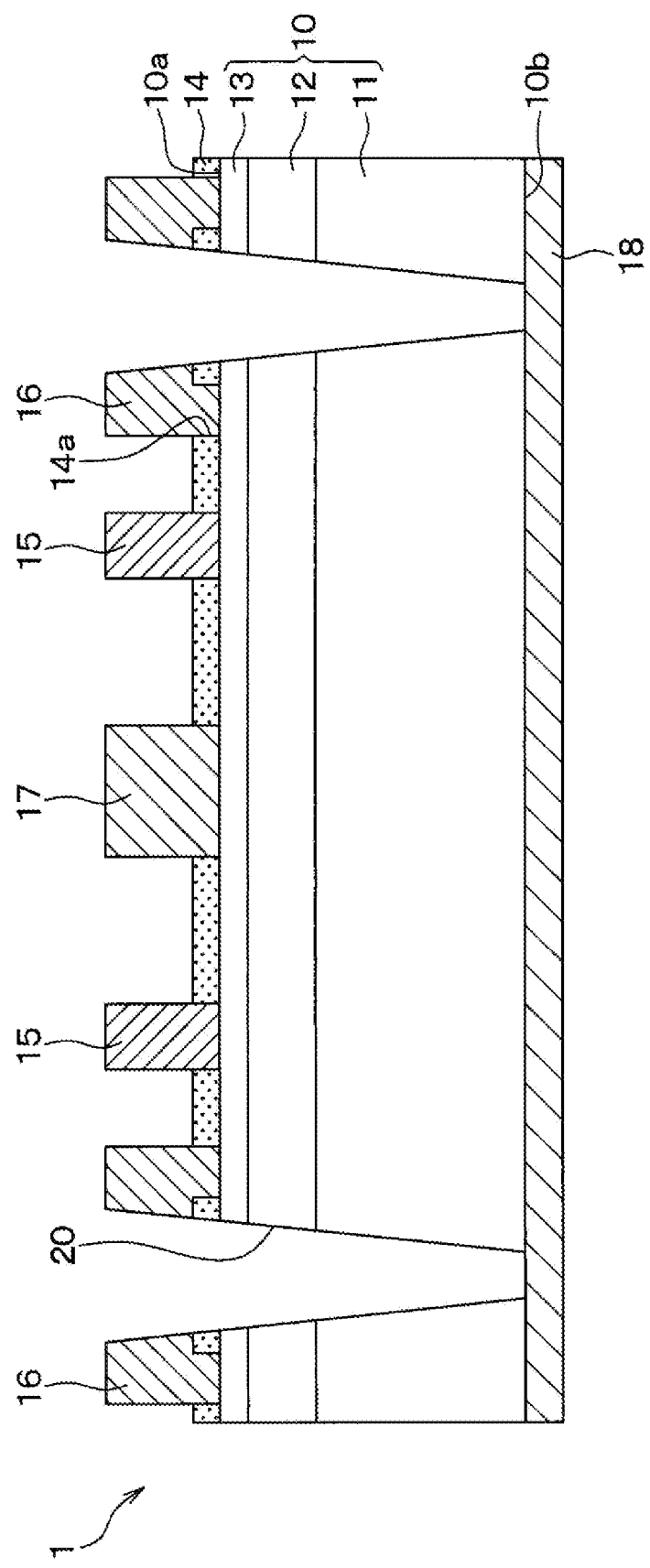
FIG. 1 is a cross-sectional view of a semiconductor chip according to a first embodiment of the present disclosure.

The inventors of the present disclosure have been studying a semiconductor chip composed of GaN. The inventors of the present disclosure have been considering to manufacture a semiconductor chip as follows. First, an epitaxial film is grown on a GaN wafer to produce a processed wafer. The processed wafer has a first surface on the epitaxial film side and a second surface on the GaN wafer side. Then, a first surface-side element component for constituting a semiconductor element is formed on the first surface side of the processed wafer, and then the processed wafer is thinned, thereby to produce the semiconductor chip.

In such a case, if the processed wafer is thinned by grinding from the second surface side of the processed wafer, it is necessary to prepare a GaN wafer every time the semiconductor chip is manufactured, which may reduce productivity. Therefore, the inventors of the present disclosure have considered to form a transformation layer inside of the processed wafer and divide the processed wafer into a part including the first surface of the processed wafer and a part including the second surface of the processed wafer by the manufacturing method in which the GaN ingot is divided into two ingots. However, according to the further consideration of the inventor of the present disclosure, it has been confirmed that, if the transformation layer is formed inside the processed wafer, the processed wafer is distorted due to nitrogen being generated and gasified during the formation of the transformation layer. Therefore, if the semiconductor chip is produced from such a processed wafer, the semiconductor chip produced may have distortion. If the semiconductor chip has the distortion, the characteristics of the semiconductor element may deteriorate. The distortion of the semiconductor chip is also caused by heat generation of the semiconductor element when the semiconductor chip is used.

The present disclosure provides a semiconductor chip capable of suppressing distortion and a method for manufacturing the same.

According to an aspect of the present disclosure, a semiconductor chip includes a chip constituent substrate formed with a semiconductor element. The chip constituent substrate has a first surface and a second surface opposite to the first surface, and includes a layer containing gallium nitride. In the chip constituent substrate, the semiconductor element is disposed such that components constituting the semiconductor element are located more in an area adjacent to the first surface than in an area adjacent to the second surface. Further, the chip constituent substrate is formed with a through hole. The through hole penetrates the chip constituent substrate from the first surface to the second surface and defines a first opening adjacent to the first surface and a second opening adjacent to the second surface. The first opening is larger than the second opening.

In the above configuration, the chip constituent substrate has the through hole in which the dimension of the first opening on the first surface side is larger than the dimension of the second opening on the second surface side. Therefore, heat of the semiconductor element generated during use can be efficiently released, and the semiconductor chip can be suppressed from being distorted.

Further, the through hole can also be used as a gas vent hole for releasing nitrogen when an epitaxial film is formed on a GaN wafer to form a processed wafer and a transformation layer for dividing the processed wafer is formed. As such, the semiconductor chip can be manufactured in a state where distortion is suppressed.

According to an aspect of the present disclosure, a method for manufacturing a semiconductor chip having a semiconductor element, includes: preparing a gallium nitride wafer which is made of gallium nitride; producing a processed wafer by forming an epitaxial film on a surface of the gallium nitride wafer, in which the processed wafer has a first surface on a side of the epitaxial film and a second surface on a side of the gallium nitride wafer, and the processed wafer includes a plurality of chip formation regions adjacent to the first surface; forming a first surface-side element component of the semiconductor element in each of the plurality of chip formation regions; forming a transformation layer, in which nitride is separated from gallium, along a planar direction of the processed wafer by irradiating an inside of the processed wafer with a laser beam from the second surface side of the processed wafer; dividing the processed wafer at the transformation layer as a boundary into a chip formation wafer including the first surface of the processed wafer and a recycle wafer including the second surface of the processed wafer; extracting the semiconductor chip from the chip formation wafer; and, before the forming of the transformation layer, forming a gas vent hole in each of the plurality of chip formation regions, the gas vent hole defining an opening on the first surface side of the processed wafer. In the forming of the transformation layer, the transformation layer is formed so as to connect to or intersect with the gas vent hole.

According to the method described above, since the transformation layer is formed so as to be connected to or intersect with the gas vent hole, nitrogen can be released from the gas vent hole during the forming of the transformation layer. As such, it is possible to suppress the distortion of the semiconductor chip in the manufacturing of the semiconductor chip.

Hereinafter, embodiments of the present disclosure will be described with reference to the drawings. In the embodiments described hereinafter, the same or equivalent parts are designated with the same reference numerals.

First Embodiment

A first embodiment will be described with reference to the drawings. First, configurations of a semiconductor chip 1 of a present embodiment will be described with reference to FIGS. 1 and 2. The semiconductor chip 1 is formed with a semiconductor element. In the present embodiment, for example, the semiconductor chip 1 is formed with a horizontal high electron mobility transistor (HEMT) as the semiconductor element. FIG. 1 corresponds to a cross-sectional view taken along a line I-I in FIG. 2.

As shown in FIG. 1, the semiconductor chip 1 is configured using a chip constituent substrate 10. The chip constituent substrate 10 includes a GaN substrate 11, an electron transport layer 12 and an electron supply layer 13. The electron transport layer 12 and the electron supply layer 13 contain GaN, and are layered on the GaN substrate 11. The electron transport layer 12 and the electron supply layer 13 are made of a material that induces 2DEG carriers in a portion on the electron transport layer 12 side at an interface between the electron transport layer 12 and the electron supply layer 13 by the piezo effect and the polarization effect. For example, the electron transport layer 12 is composed of a non-doped GaN layer or the like, and the electron supply layer 13 is composed of an AlGaN layer or the like. The electron transport layer 12 and the electron supply layer 13 are made of an epitaxial film. In the following description, the surface of the chip constituent substrate 10 on the electron supply layer 13 side will be referred to as a first surface 10a of the chip constituent substrate 10, and the surface of the chip constituent substrate 10 on the substrate 11 side will be referred to as a second surface 10b of the chip constituent substrate 10.

An insulating film 14 made of a nitride film or the like is formed on the first surface 10a of the chip constituent substrate 10. A gate electrode 15 is arranged on the insulating film 14. Further, a source electrode 16 and a drain electrode 17 are arranged on opposite sides of the gate electrode 15 on the insulating film 14. In other words, the gate electrode 15 is arranged between the source electrode 16 and the drain electrode 17. Specifically, the gate electrode 15, the source electrode 16, and the drain electrode 17 are arranged on the insulating film 14 so as to come into contact with the electron supply layer 13 through contact holes 14a formed in the insulating film 14. A back surface electrode 18 is formed on the second surface 120b side of the chip constituent substrate 10. The back surface electrode 18 is provided to stabilize the potential in the substrate 11. In the present embodiment, the back surface electrode 18 is connected to the source electrode 16 in a cross section different from that shown in FIG. 1 so as to have the same potential as the source electrode 16.

FIG. 2 is a plan view showing a part of the semiconductor chip 1. The source electrode 16, the gate electrode 15 and the drain electrode 17 are arranged in an arrangement direction, e.g., a left and right direction in FIG. 2. In an actual semiconductor chip 1, for example, a plurality of source electrodes 16, gate electrodes 15, and drain electrodes 17 are further formed in the arrangement direction. In the present embodiment, the source electrode 16 corresponds to a front surface electrode or a first surface electrode. The back surface electrode 18 corresponds to a second surface electrode.

The above is the configuration of the semiconductor element formed in the semiconductor chip 1 of the present embodiment. In such a semiconductor chip 1, a current flows between the source electrode 16 and the drain electrode 17 via 2DEG carriers formed at the interface between the electron transport layer 12 and the electron supply layer 13. When a predetermined voltage is applied to the gate electrode 15, the current is cut off. In this case, in the chip constituent substrate 10, the current less flows in a portion that is located below the central portion of the source electrode 16 with respect to the arrangement direction of the source electrode 16, the gate electrode 15, and the drain electrode 17. Further, since the semiconductor chip 1 is configured as described above, components constituting the semiconductor element are located more in an area adjacent to the first surface 10a than in an area adjacent to the second surface 10b. That is, the components of the semiconductor element are mostly or densely located adjacent to the first surface 10a. Thus, the temperature of the first surface 10a side of the semiconductor chip 1 is likely to be higher than the temperature of the second surface 10b side when in use of the semiconductor chip 1.

The chip constituent substrate 10 of the present embodiment is formed with a through hole 20 penetrating between the first surface 10a and the second surface 10b. Specifically, the back surface electrode 18 is formed on the second surface 10b of the chip constituent substrate 10, and the through hole 20 is formed so as to expose the back surface electrode 18 in the through hole 20.

Further, the through hole 20 is formed at a position in the chip constituent substrate 10 that does not easily affect the characteristics of the semiconductor element. The semiconductor chip 1 of the present embodiment is formed with the horizontal HEMT as the semiconductor element as described above. In such a configuration, the current less flows in the portion below the central portion of the source electrode 16. Therefore, in the semiconductor chip 1 of the present embodiment, the through hole 20 is formed in the portion of the chip constituent substrate 10 located below the central portion of the source electrode 16. On the first surface 10a side of the chip constituent substrate 10, the source electrode 16 is located on a periphery of the through hole 20. In the present embodiment, the portion or the position of the chip constituent substrate 10 located below the central portion of the source electrode 16 corresponds to a portion or a position different from the components constituting the semiconductor element.

Further, the through hole 20 is formed so that a dimension (e.g., width) of a first opening adjacent to the first surface 10a is larger than a dimension (e.g., width) of a second opening adjacent to the second surface 10b. That is, the through hole 20 has a tapered shape that tapers from the first surface 10a side toward the second surface 10b side. In the present embodiment, the through hole 20 has a cylindrical shape with a circular opening. Therefore, it can be said that the through hole 20 has a cylindrical shape in which the diameter of the first opening adjacent to the first surface 10a is larger than the diameter of the second opening adjacent to the second surface 10b.

The semiconductor chip 1 of the present embodiment has the configurations as described above. Next, a method for manufacturing the semiconductor chip 1 will be described with reference to FIGS. 3A to 3L.

Figure 3A:
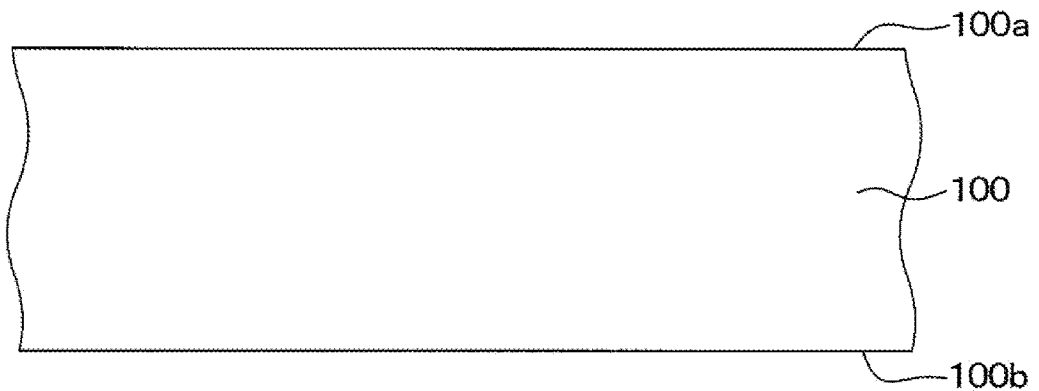
FIG. 3A is a cross-sectional view illustrating a manufacturing process of a semiconductor chip according to a first embodiment of the present disclosure.

First, as shown in FIG. 3A, a GaN wafer 100 in a bulk wafer shape is prepared. The GaN wafer 100 has a first surface 100a and a second surface 100b. The GaN wafer 100 forms the substrate 11 of the semiconductor chip 1. The thickness of the GaN wafer 100 is arbitrary, but is, for example, about 400 μm. In the GaN wafer 100 of the present embodiment, the first surface 100a is a Ga plane and the second surface 100b is an N plane. Note that, after a manufacturing process of the semiconductor chip 1 described below is performed, the GaN wafer 100 is prepared by recycling a recycle wafer 170 of FIG. 3L, which will be described later.

Figure 3B:
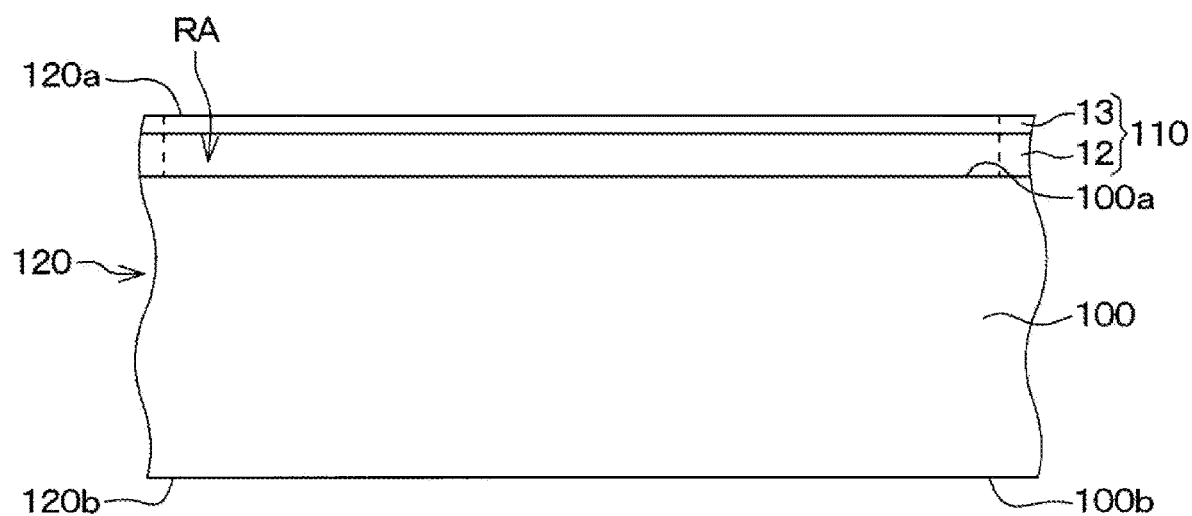
FIG. 3B is a cross-sectional view illustrating a manufacturing process of the semiconductor chip subsequent to FIG. 3A.

Next, as shown in FIG. 3B, a processed wafer 120 having a plurality of chip formation regions RA is prepared by forming an epitaxial film 110 containing GaN on the first surface 100a of the GaN wafer 100. As described above, the epitaxial film 110 of the present embodiment is configured by the electron transport layer 12 and the electron supply layer 13 layered on the electron transport layer 12. Hereinafter, a surface of the processed wafer 120 on the epitaxial film 110 side is referred to as a first surface 120a of the processed wafer 120, and a surface of the processed wafer 120 on the GaN wafer 100 side is referred to as a second surface 120b of the processed wafer 120. The chip formation regions RA are provided adjacent to the first surface 120a of the processed wafer 120. Although one chip formation region RA is shown in FIG. 3B, a plurality of chip formation regions RA are actually formed in the processed wafer 120.

Figure 3C:
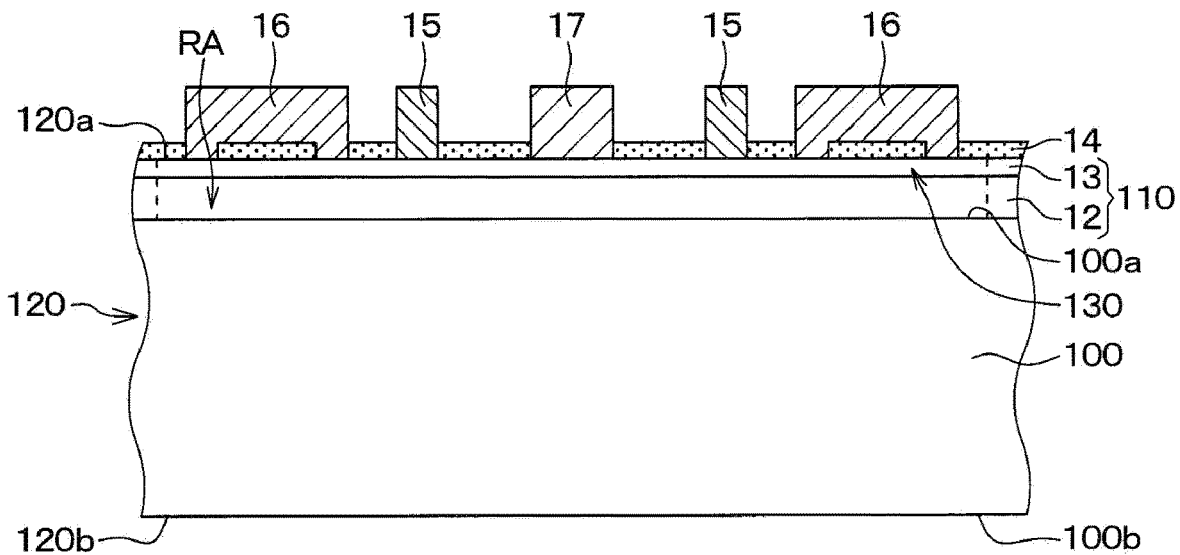
FIG. 3C is a cross-sectional view illustrating a manufacturing process of the semiconductor chip subsequent to FIG. 3B.

Next, as shown in FIG. 3C, a general semiconductor manufacturing process is performed. Namely, a process of forming a first surface-side element component 130 of the semiconductor element is performed. For example, the first surface-side element component 130 of the semiconductor element includes the insulating film 14, the gate electrode 15, the source electrode 16, the drain electrode 17 and the like. In FIG. 3C, two source electrodes 16, two gate electrodes 15, and one drain electrode 17 are shown as the first surface-side element component 130. However, in reality, a plurality of source electrodes 16, gate electrodes 15, and drain electrodes 17 are further formed in each chip formation region RA.

Figure 3D:
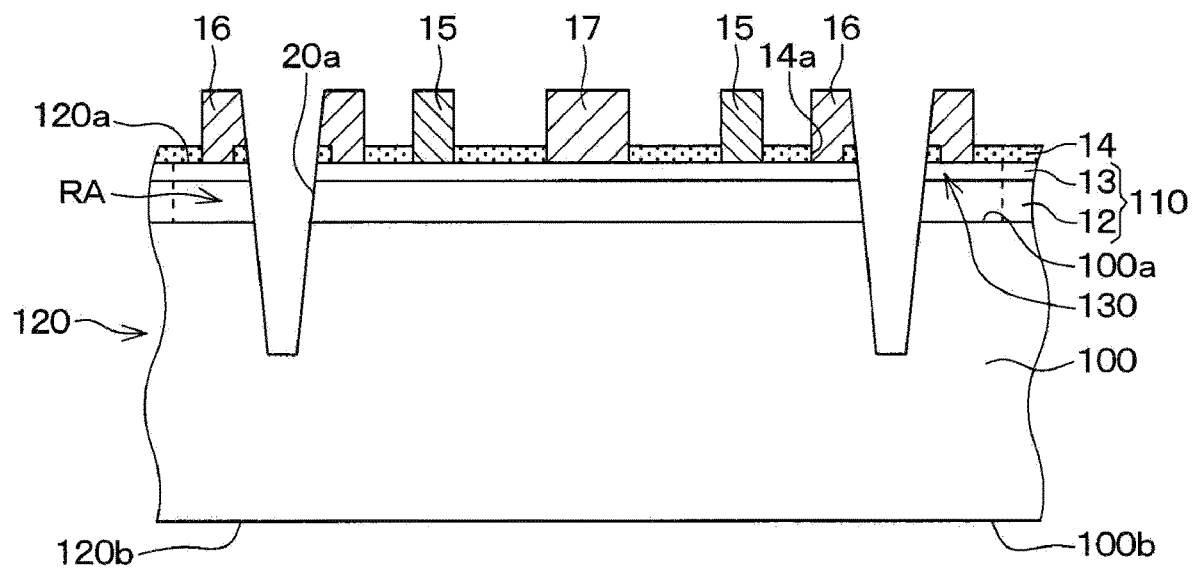
FIG. 3D is a cross-sectional view illustrating a manufacturing process of the semiconductor chip subsequent to FIG. 3C.

Next, as shown in FIG. 3D, a gas vent hole 20a is formed in each chip formation region RA. Specifically, the gas vent hole 20a serves as the through hole 20 after the semiconductor chip 1 is manufactured, and is formed in a portion that does not easily affect the characteristics of the semiconductor element. That is, in the present embodiment, the gas vent hole 20a is formed at a position below the central portion of the source electrode 16.

Further, the gas vent hole 20a is formed so that the bottom portion is located inside the GaN wafer 100. However, the depth of the gas vent hole 20a is adjusted so that nitrogen generated by forming the transformation layer 150 can be released to the outside, when the transformation layer 150 of FIG. 3F, which will be described later, is formed. Specifically, the depth of the gas vent hole 20a is adjusted so that the gas vent hole 20a connects to or intersects with the transformation layer 150 when the transformation layer 150 is formed as will be described later.

The gas vent hole 20a of the present embodiment is formed by radiating a laser beam L from the first surface 120a side of the processed wafer 120 and removing the irradiated portion. That is, the gas vent hole 20a of the present embodiment is formed by a laser ablation processing.

In the present embodiment, a laser device is prepared for forming the gas vent hole 20a. The laser device includes a laser light source that oscillates a laser beam L, a dichroic mirror that is arranged so as to change the direction of an optical axis (that is, the optical path) of the laser beam L, a condensing lens (that is, a condensing optical system) for condensing light, a displaceable stage, and the like. In forming the gas vent hole 20a, the processed wafer 120 is placed on the stage, and the laser beam L is applied so that a condensing point moves in the thickness direction of the processed wafer 120. At this time, in the present embodiment, the laser beam L is applied so that the condensing point moves from the first surface 120a side toward the second surface 120b side in the processed wafer 120. As a result, the gas vent hole 20a in which the dimension on the opening side is larger than the dimension on the bottom side is formed.

As the laser beam L, for example, an ultraviolet laser having a wavelength of 355 nm or the like is used. The laser beam L is radiated under the conditions that the processing point output is 2 µJ and the pulse width is 500 ps. However, these conditions are only examples, and the inventors of the present disclosure have confirmed that the gas vent hole 20a can be appropriately formed even when the processing point output of the laser beam L is further lower or the pulse width is further shorter than the example conditions. Further, the inventors of the present disclosure have confirmed that the gas vent hole 20a can be appropriately formed even when the processing point output of the laser beam L is further higher or the pulse width is further longer than the example conditions.

Figure 3E:
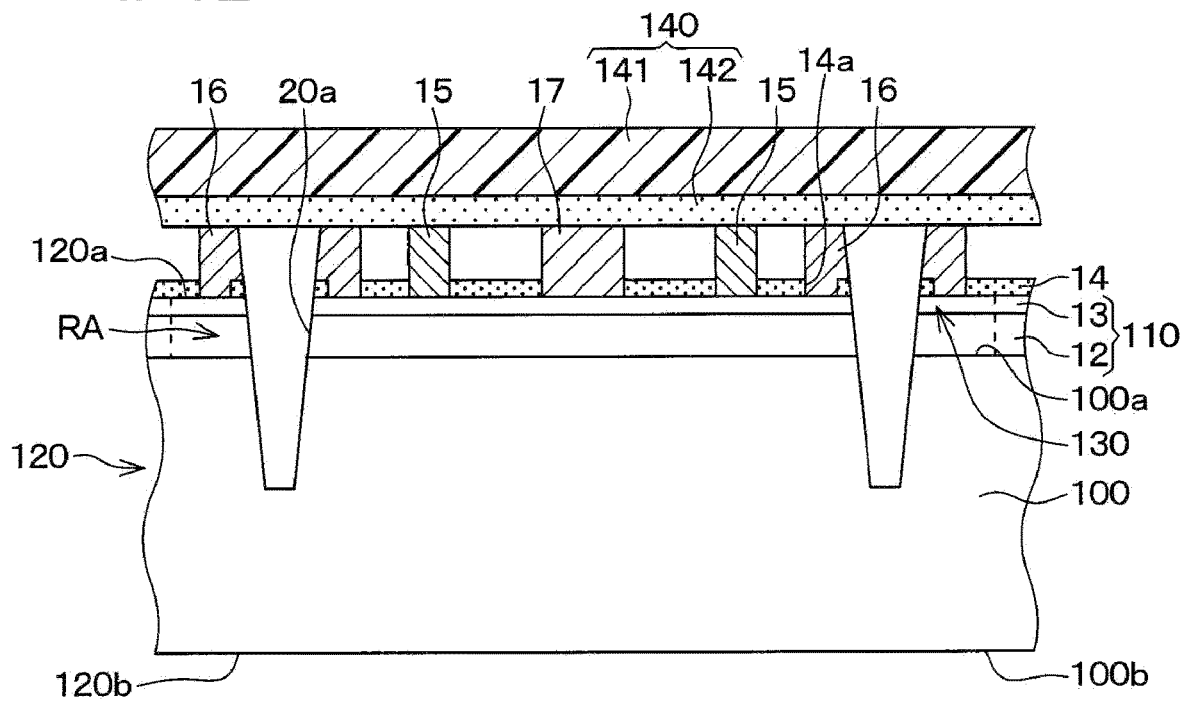
FIG. 3E is a cross-sectional view illustrating a manufacturing process of the semiconductor chip subsequent to FIG. 3D.

Next, as shown in FIG. 3E, a holding member 140 is arranged on the processed wafer 120 adjacent to the first surface 10a of the processed wafer 120. As the holding member 140, for example, a dicing tape or the like having a base material 141 and an adhesive 142 is used. The base material 141 is made of a material that does not easily warp during the manufacturing process. For example, the base material 141 is made of glass, a silicon substrate, ceramics, or the like. The adhesive 142 is made of a material whose adhesive force can be changed. For example, the adhesive 142 is made of an adhesive whose adhesive force changes depending on temperature or light. In this case, the adhesive 142 is made of, for example, an ultraviolet curable resin, wax, double-sided tape, or the like. Note that the adhesive 142 is made of a material that maintains the adhesive force even when a second surface-side element component 190 of FIG. 3H, which will be described later, is formed.

Figure 3F:
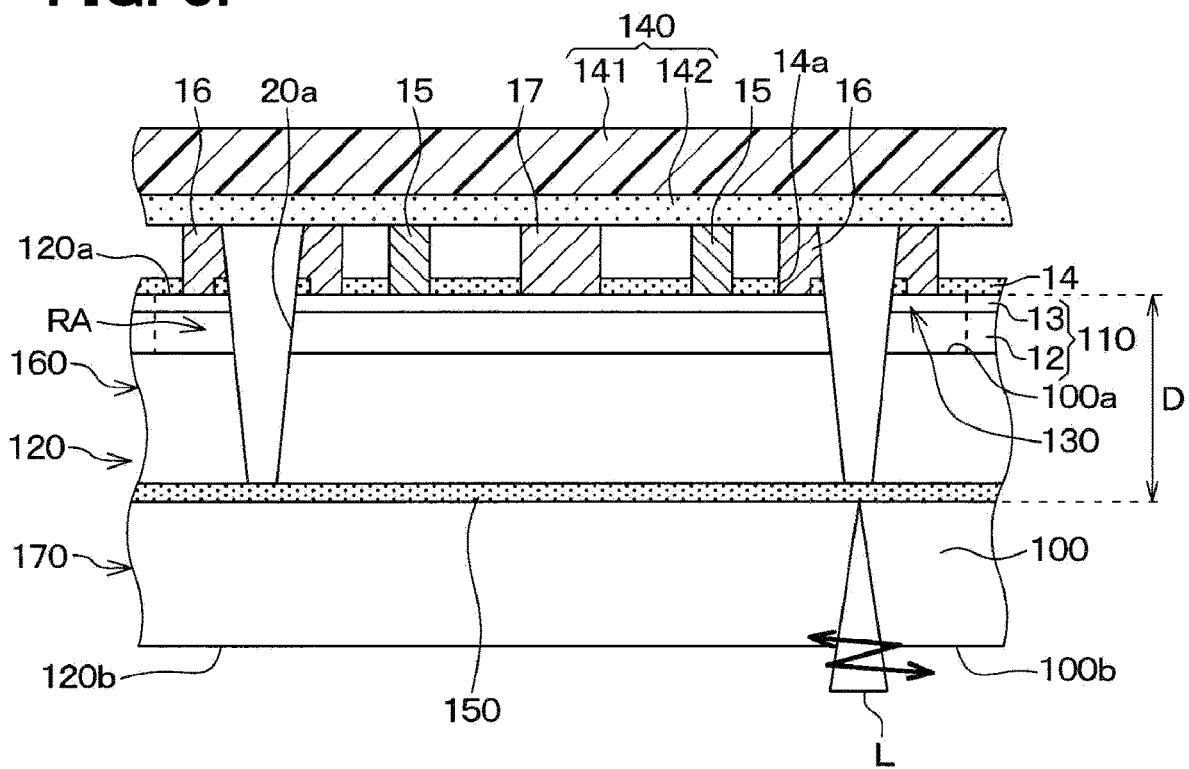
FIG. 3F is a cross-sectional view illustrating a manufacturing process of the semiconductor chip subsequent to FIG. 3E.

Next, as shown in FIG. 3F, the laser beam L is emitted from the second surface 120b side of the processed wafer 120 so as to form the transformation layer 150 along a planar direction of the processed wafer 120 in a predetermined depth D from the first surface 120a of the processed wafer 120. In the present embodiment, the transformation layer 150 is formed by using the same laser device as the one used in the process of FIG. 3D.

Further, when the transformation layer 150 is formed, the position of the stage or the like is adjusted so that the condensing point of the laser beam L is relatively moved along the planar direction of the processed wafer 120. As a result, gallium and nitrogen are decomposed by thermal energy, and the transformation layer 150 in which gallium is deposited and nitrogen is gasified is formed in the processed wafer 120.

In the present embodiment, the transformation layer 150 is formed so as to connect to or intersect with the gas vent hole 20a. Note that FIG. 3F illustrates an example in which the transformation layer 150 is formed so as to connect to the gas vent hole 20a. However, as described above, the trans-formation layer 150 may be formed so as to intersect with the gas vent hole 20a in a manner that the transformation layer 150 is located closer to the first surface 120a of the processed wafer 120 than the bottom surface of the gas vent hole 20a. In the present embodiment, therefore, it is possible to suppress each chip formation region RA from being applied with a large distortion when the transformation layer 150 is formed.

Figure 4A:
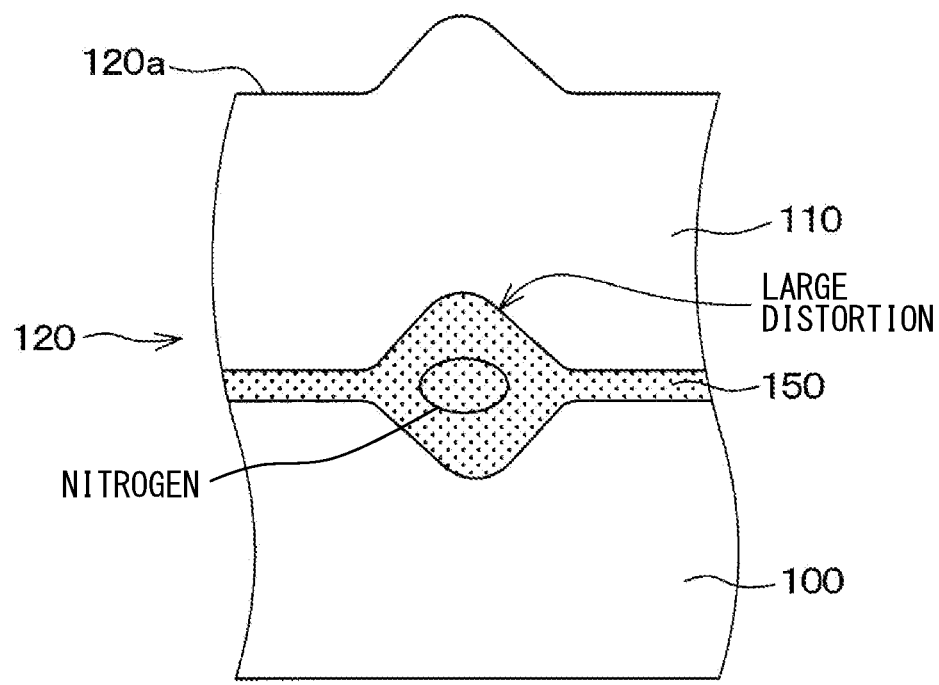
FIG. 4A is a schematic diagram for explaining a case where a transformation layer is formed without forming gas vent holes.
Figure 4B:
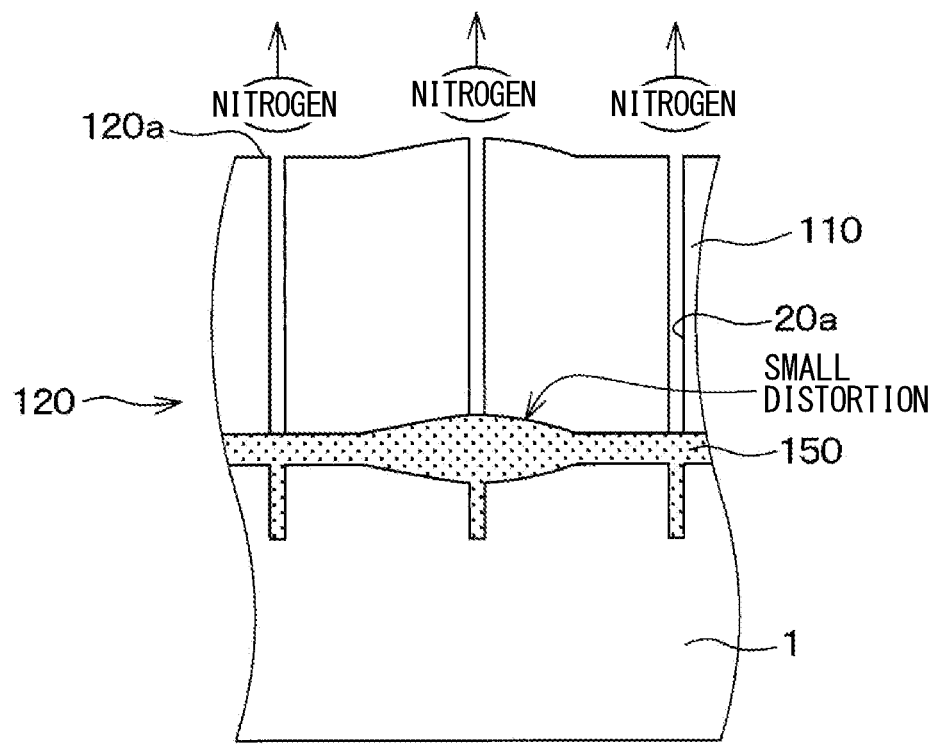
FIG. 4B is a schematic diagram for explaining a case where the transformation layer is formed after forming the gas vent holes.

That is, in a case where the gas vent hole 20a is not formed, as shown in FIG. 4A, the nitrogen generated when the transformation layer 150 is formed is less likely to be released to the outside. As a result, the distortion of the processed wafer 120 due to the formation of the transformation layer 150 is likely to be enlarged. On the other hand, in the present embodiment, the gas vent hole 20a is formed, and the transformation layer 150 is formed so as to intersect with the gas vent hole 20a. Therefore, as shown in FIG. 4B, the nitrogen generated when the transformation layer 150 is formed is easily released to the outside through the gas vent hole 20a. As such, it is possible to suppress the enlargement of the distortion of the processed wafer 120 due to the formation of the transformation layer 150. As a result, the distortion applied to each chip formation region RA can be reduced.

Although not particularly limited, in the present embodiment, a solid-state green laser beam having a wavelength of 532 nm is used as the laser beam L to form the transformation layer 150. The laser beam L is emitted to have a processing point output of 0.1 µJ to 0.3 µJ, a pulse width of 500 ps, and a processing speed of 50 mm/s to 500 mm/s. However, these conditions are only examples, and the inventors of the present disclosure have confirmed that the transformation layer 150 can be appropriately formed even when the processing point output of the laser beam is further lower or the pulse width is further smaller than the example conditions. Further, the inventors of the present disclosure have confirmed that the transformation layer 150 can be appropriately formed even when the processing point output of the laser beam L is further higher or the pulse width is further longer than the example conditions.

The predetermined depth D where the transformation layer 150 is formed is set according to the ease of handling of the semiconductor chip 1, the withstand voltage, and the like, and is also set according to the configuration of the chip constituent substrate 10 constituting the semiconductor chip 1. In the present embodiment, since the chip constituent substrate 10 constituting the semiconductor chip 1 has the substrate 11 provided by the GaN wafer 100, the transformation layer 150 is formed inside the GaN wafer 100. Although not particularly shown, in a case where the chip constituent substrate 10 constituting the semiconductor chip 1 is composed of only the epitaxial film 110, the transformation layer 150 is formed at the boundary between the epitaxial film 110 and the GaN wafer 100.

Figure 5:
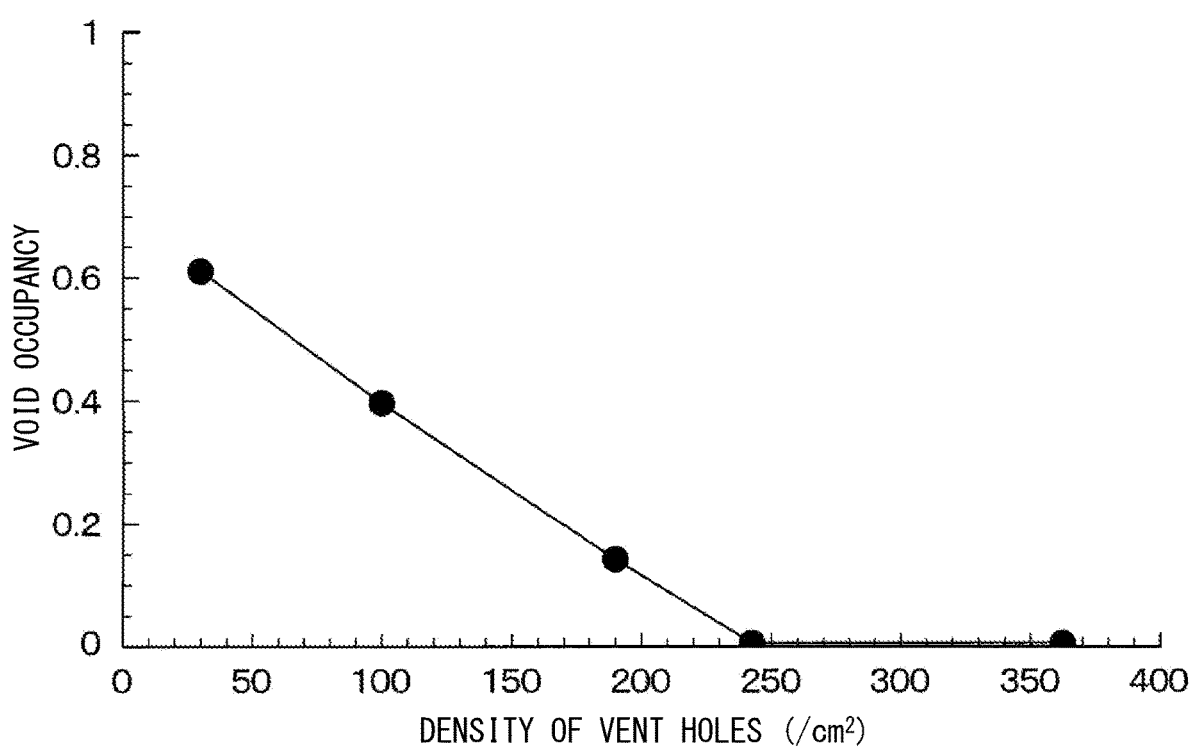
FIG. 5 is a diagram illustrating a relationship between the density of the gas vent holes and a void occupancy.

Here, according to the study by the inventors of the present disclosure, the density of the gas vent holes 20a and the void occupancy in the chip formation region RA have the relationship shown in FIG. 5. In this case, the void occupancy indicates the proportion of nitrogen in the transformation layer 150. For example, when the void occupancy is 0, it means that almost no nitrogen remains in the transformation layer 150. Further, the density of the gas vent holes 20a indicates the density of the gas vent holes 20a formed in each chip formation region RA.

According to the study by the inventors of the present disclosure, it has been confirmed that when the density of the gas vent holes 20a is $100/cm^2$ or more, the non-defective rate of the semiconductor chip 1 begins to improve. Further, it has been confirmed that when the density of the gas vent hole 20a is 200/cm² or more, no defect is observed in the semiconductor chip 1 in the measured range, and the non-defective rate is significantly improved. Moreover, it has been confirmed that when the density of the gas vent hole 20a is 250/cm² or more, the residual nitrogen itself in the transformation layer 150 is suppressed as shown in FIG. 5. Therefore, the gas vent holes 20a are preferably formed so as to satisfy the density of 100/cm² or more. The gas vent holes 20a are more preferably formed so as to satisfy the density of 200/cm² or more, or the density of 250/cm² or more.

Hereinafter, the part of the processed wafer 120 on the first surface 120a side from the transformation layer 150 will be referred to as a chip formation wafer 160, and the part of the processed wafer 120 on the second surface 120b side from the transformation layer 150 will be referred to as a recycle wafer 170.

Figure 3G:
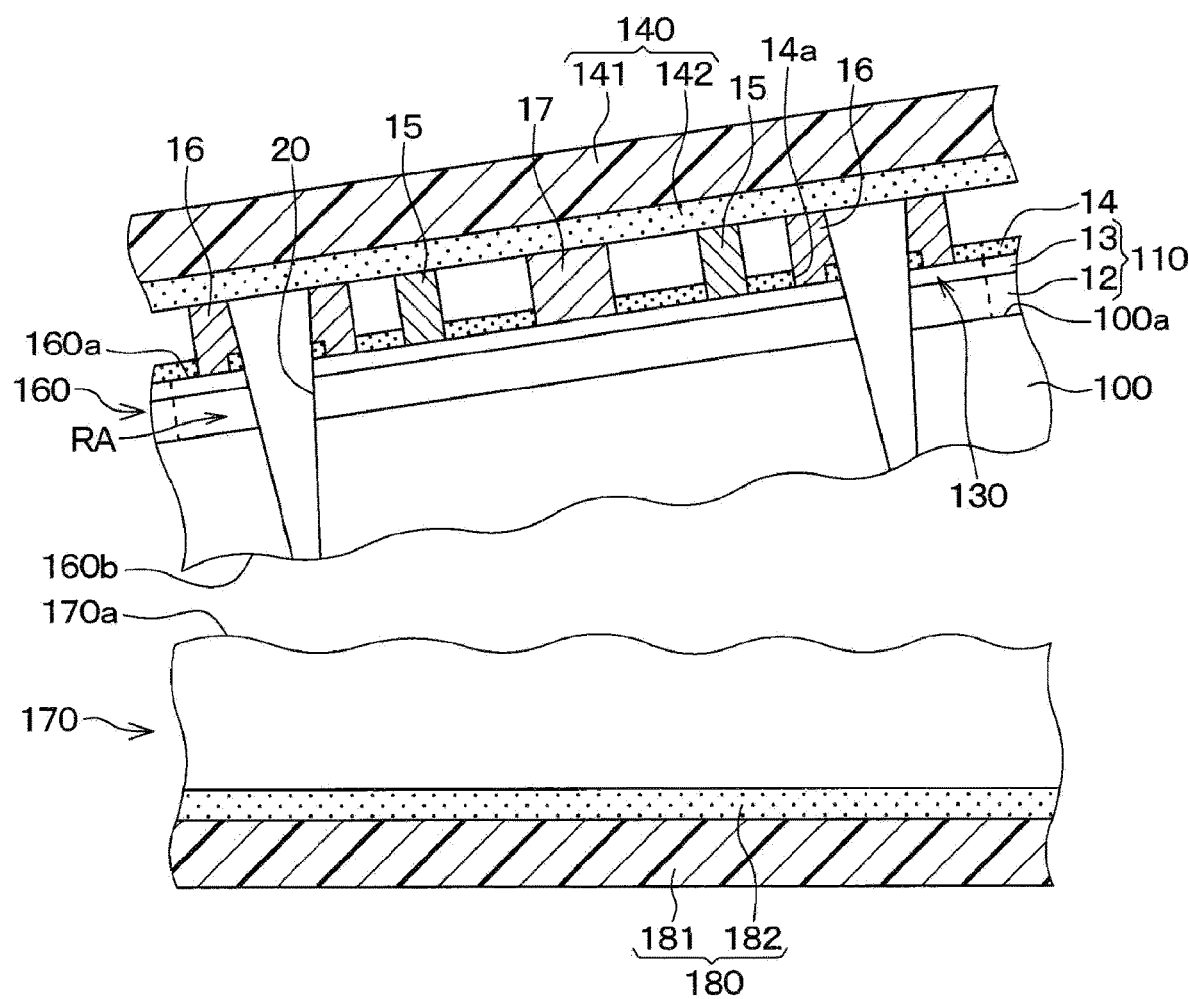
FIG. 3G is a cross-sectional view illustrating a manufacturing process of the semiconductor chip sequent to FIG. 3F.

Next, as shown in FIG. 3G, an auxiliary member 180 is arranged on the second surface 120b side of the processed wafer 120. For example, the auxiliary member 180 includes a base material 181 and an adhesive 182 capable of changing the adhesive force, similarly to the holding member 140. In this case, the base material 181 of the auxiliary member 180 is made of, for example, glass, a silicon substrate, ceramics, or the like. Also, the adhesive 182 of the auxiliary member 180 is made of, for example, an ultraviolet curable resin, wax, double-sided tape, or the like. The holding member 140 and the auxiliary member 180 are held and a tensile force or the like is applied in the thickness direction of the processed wafer 120, so that the processed wafer 120 is divided into the chip formation wafer 160 and the recycle wafer 170 at the transformation layer 150 as the boundary (that is, the starting point of dividing). As a result, the through hole 20 is included in the chip formation wafer 160.

In the following description, the surface of the chip formation wafer 160 on which the first surface-side element component 130 is formed is referred to as a first surface 160a. Also, the surface of the chip formation wafer 160 from which the recycle wafer 170 has been separated is referred to as a second surface 160b. Further, the surface of the recycle wafer 170 from which the chip formation wafer 160 has been separated is referred to as a first surface 170a. In FIG. 3G and the figures after FIG. 3G, the illustration of the transformation layer 150 remaining on the second surface 160b of the chip formation wafer 160 and the first surface 170a of the recycle wafer 170 is appropriately omitted.

Figure 3H:
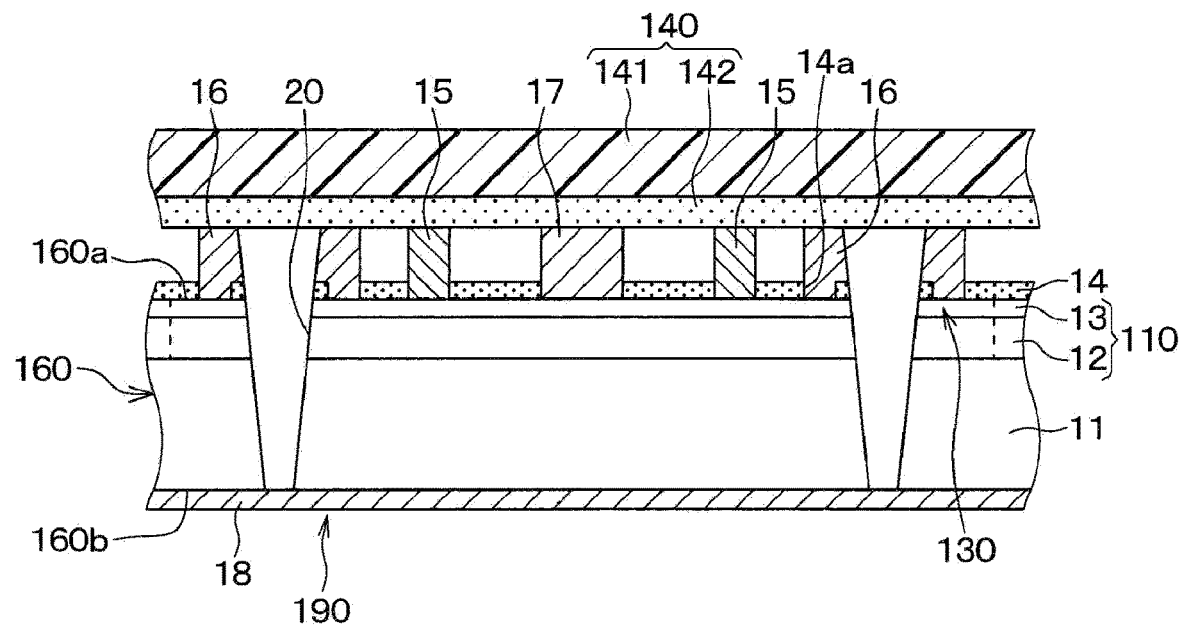
FIG. 3H is a cross-sectional view illustrating a manufacturing process of the semiconductor device subsequent to FIG. 3G.

Thereafter, as shown in FIG. 3H, a general semiconductor manufacturing process is performed to form the second surface-side element component 190 of the semiconductor element, such as the back surface electrode 18, on the second surface 160b of the chip formation wafer 160.

Before the process of forming the second surface-side element component 190, a process of flattening the second surface 160b of the chip formation wafer 160 by a chemical mechanical polishing (CMP) method or the like may be performed as necessary. FIG. 3H shows a cross-sectional view of the case where the second surface 160b of the chip formation wafer 160 is flattened. Further, after performing the process of forming the second surface-side element component 190, a heat treatment such as laser annealing may be performed in order to make ohmic contact between the back surface electrode 18 and the second surface 160b of the chip formation wafer 160 as necessary.

Figure 3I:
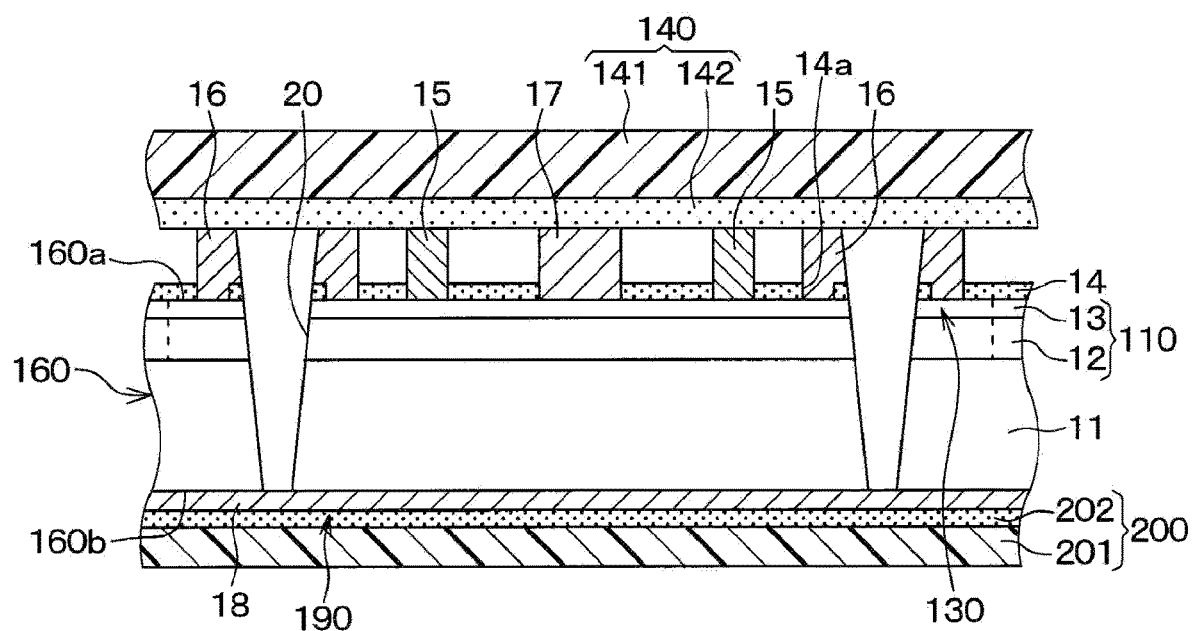
FIG. 3I is a cross-sectional view illustrating a manufacturing process of the semiconductor chip subsequent to FIG. 3H.

Next, as shown in FIG. 3I, a holding member 200 is arranged on the second surface 160b side of the chip formation wafer 160, that is, on the back surface electrode 18 side. As the holding member 200, for example, a dicing tape or the like having a base material 201 and an adhesive 202 is used. The adhesive 202 is made of a material whose adhesive force can be changed. For example, the adhesive 202 is made of an adhesive whose adhesive force changes depending on temperature or light.

Figure 3J:
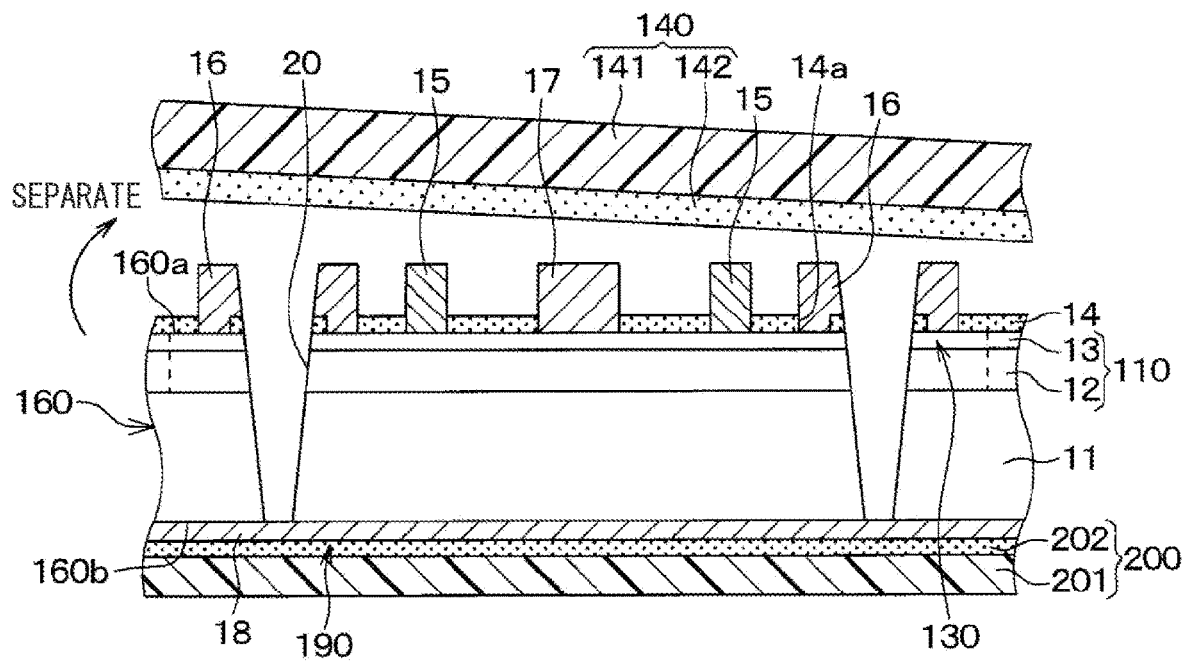
FIG. 3J is a cross-sectional view illustrating a manufacturing process of the semiconductor chip subsequent to FIG. 3I.

Thereafter, as shown in FIG. 3J, the base material 141 attached to first surface 160a side of the chip formation wafer 160 is separated. In this case, a process of reducing the adhesive force of the adhesive 142 which adheres the base material 141 to the chip formation wafer 160 is performed to peel off the base material 141. For example, in a case where the adhesive 142 is made of a UV resin adhesive, UV radiation is performed.

Figure 3K:
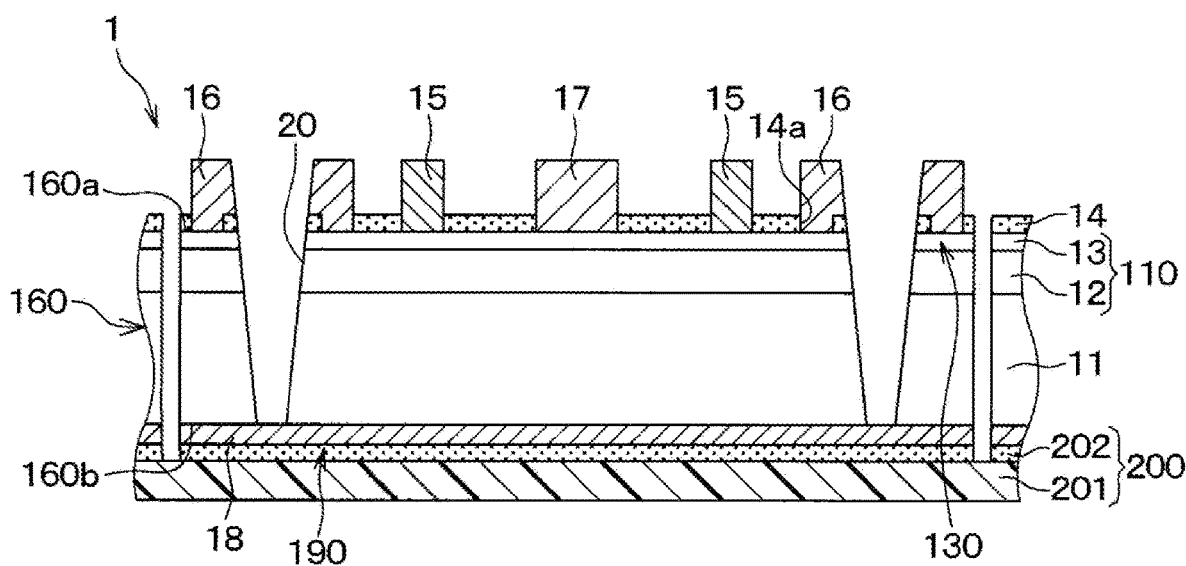
FIG. 3K is a cross-sectional view illustrating a manufacturing process of the semiconductor chip following FIG. 3J.
Figure 3L:
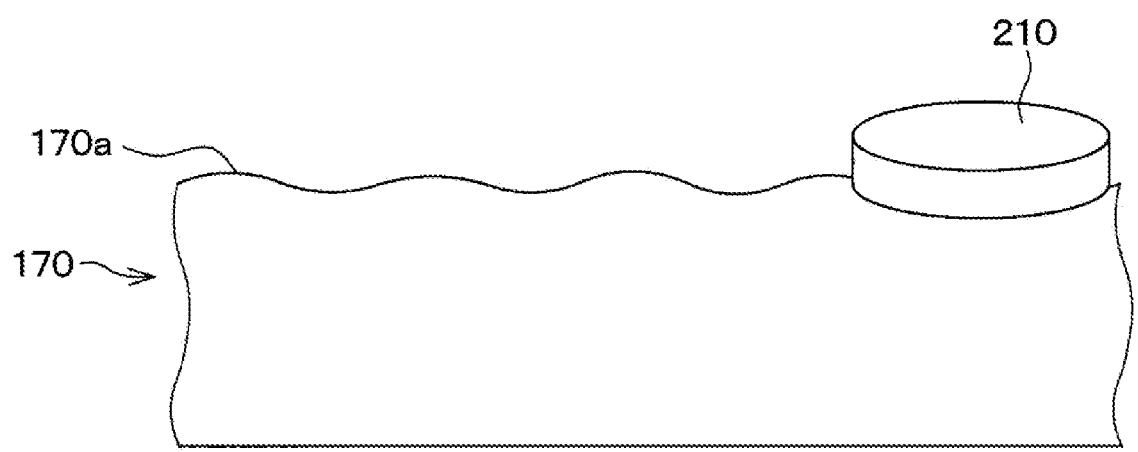
FIG. 3L is a cross-sectional view illustrating a manufacturing process of the semiconductor chip subsequent to FIG. 3K.

Next, as shown in FIG. 3K, the chip formation wafer 160 is diced into chip units as the semiconductor chips 1 by a dicing saw, laser dicing, or the like. At this time, it is preferable to adjust the dicing depth so that the holding member 200 is kept connected without being cut while the chip formation wafer 160 is divided into chip units.

Although the subsequent processes for the semiconductor chip 1 are not shown, the holding member 200 is expanded and the distance between the semiconductor chips 1 is widened at the dicing cut portion. Thereafter, the adhesive force of the adhesive 202 is reduced by a heat treatment or irradiation with light, and the semiconductor chips 1 are picked up. In this way, the semiconductor chips 100 are manufactured. In the semiconductor chip 1 manufactured in this way, the chip constituent substrate 10 is provided by the chip formation wafer 160.

Further, as shown in FIG. 3J, the first surface 170a of the recycle wafer 170 produced in the process of FIG. 3G is flattened by performing a CMP technique using a polishing apparatus 210 or the like on the first surface 170a. Then, the flattened recycle wafer 170 is used as the GaN wafer 100, and the processes of FIG. 1A and after are performed again. As a result, the GaN wafer 100 can be used a plurality of times to form the semiconductor chips 1.

According to the present embodiment described above, the semiconductor chip 1 is formed with the through hole 20 penetrating from the first surface 10a to the second surface 10b of the chip constituent substrate 10. In the through hole 20, the dimension of the first opening on the first surface 10a side is larger than the dimension of the second opening on the second surface 10b side. In the semiconductor chip 1 of the present embodiment, the electron transport layer 12 and the electron supply layer 13 are formed on the first surface 10a side. Therefore, the temperature on the first surface 10a side tends to be higher than the temperature on the second surface 10b side when the semiconductor chip 1 is used. As such, the heat of the semiconductor element during use can be efficiently released, and the semiconductor chip 1 can be suppressed from being distorted.

Since the through hole 20 is formed in the semiconductor chip 1, nitrogen can be released through the through hole 20 when the semiconductor chip 1 is manufactured from the processed wafer 120. Therefore, it is possible to suppress the semiconductor chip 1 from being distorted when the semiconductor chip 1 is manufactured.

In the present embodiment, the through hole 20 is formed in the portion different from the portion constituting the semiconductor element in the chip constituent substrate 10. Therefore, it is less likely that the characteristics of the semiconductor element will be degraded by forming the through hole 20.

Second Embodiment

A second embodiment will be described with reference to FIG. 6. In the present embodiment, a through electrode is arranged in the through hole 20 in the configuration of the first embodiment. The other configurations of the present embodiment are the same as those of the first embodiment, and thus descriptions of the same configurations will be omitted hereinafter.

Figure 6:
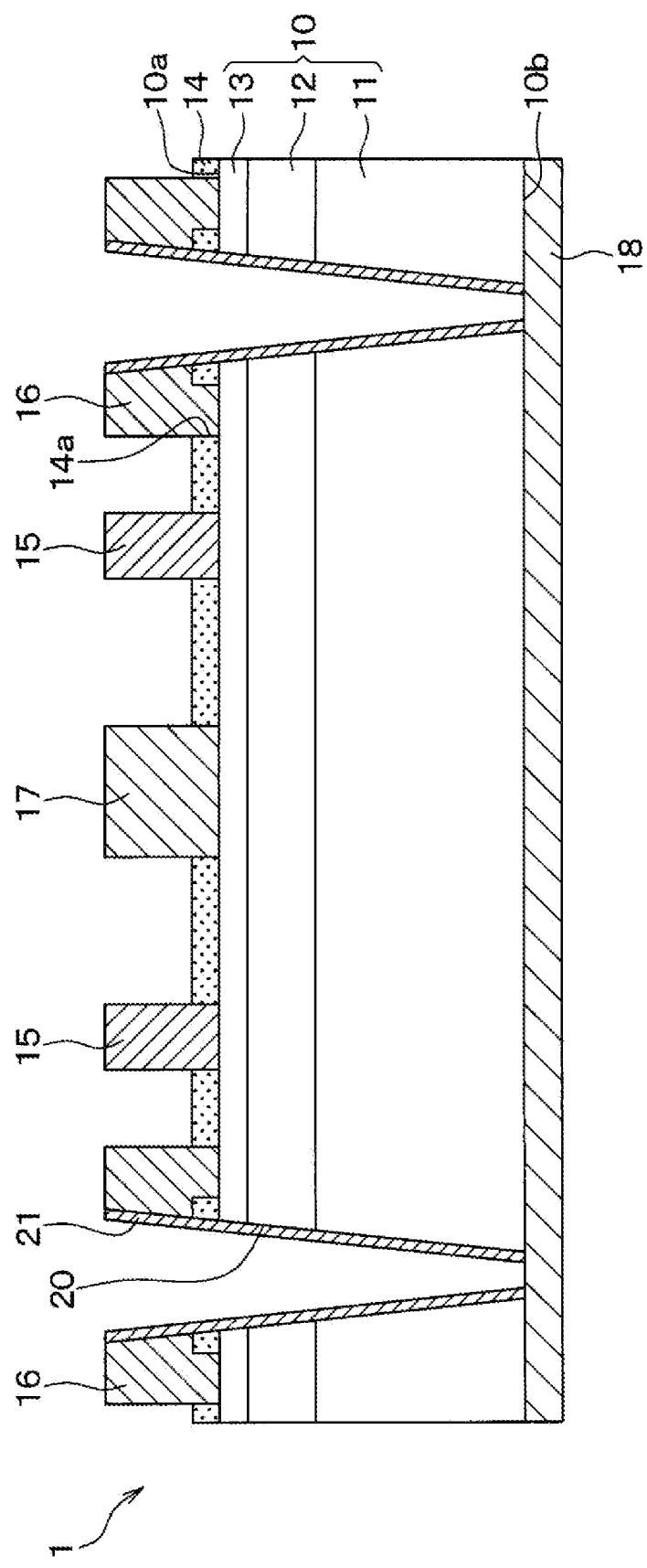
FIG. 6 is a cross-sectional view of a semiconductor chip according to a second embodiment of the present disclosure.

In a semiconductor chip 1 of the present embodiment, as shown in FIG. 6, a metal film 21 is arranged in the through hole 20. In the present embodiment, the metal film 21 is arranged so as to connect the source electrode 16 and the back surface electrode 18. That is, the metal film 21 of the present embodiment also functions as a through electrode connecting the source electrode 16 and the back surface electrode 18.

To produce such a semiconductor chip 1, for example, the metal film 21 may be arranged in the gas vent hole 20a after performing the process of FIG. 3D and before performing the process of FIG. 3E. Then, when the back surface electrode 18 is formed by performing the process of FIG. 3H, the back surface electrode 18 and the metal film 21 may be electrically connected to each other.

According to the present embodiment described above, since the through hole 20 is formed in the chip constituent substrate 10, the same effects as those of the first embodiment can be obtained.

In the present embodiment, the metal film 21 is arranged in the through hole 20. Therefore, the heat of the semiconductor element can be released more efficiently through the metal film 21. Further, since the through electrode is formed by arranging the metal film 21 in the through hole 20, it is not necessary to prepare a separate member for electrically connecting the source electrode 16 and the back surface electrode 18. As such, the configurations can be simplified.

Other Embodiments

Although the present disclosure has been described in accordance with the embodiments, it is understood that the present disclosure is not limited to such embodiments or structures. The present disclosure encompasses various modifications and variations within the scope of equivalents. In addition, while the various elements are shown in various combinations and configurations, which are exemplary, other combinations and configurations, including more, less or only a single element, are also within the spirit and scope of the present disclosure.

For example, in each of the embodiments described above, the horizontal HEMT is exemplarily formed in the semiconductor chip 1 as the semiconductor element. However, the semiconductor element formed in the semiconductor chip 1 can be appropriately changed, and for example, a horizontal metal oxide semiconductor field effect transistor (MOSFET) may be formed. Even if the MOSFET is formed in the semiconductor chip 1, the components constituting the semiconductor element are more densely formed on the first surface 10a side on which the gate electrode 15 and the like are formed than on the second surface 10b side, and thus the temperature on the first surface 10a side is likely rise higher than the temperature on the second surface 10b side. As such, the same effects as those of the first embodiment can be obtained.

Further, in each of the embodiments described above, in the process of FIG. 3H, the back surface electrode 18 may be formed without polishing the second surface 160b of the chip formation wafer 160. For example, when an optical semiconductor element or the like is formed as the semiconductor element, a rough structure may be formed on the second surface 10b of the semiconductor chip 1. In this case, it is possible to effectively extract light from the second surface 10b side. Immediately after the processed wafer 120 is divided into the chip formation wafer 160 and the recycle wafer 170, the second surface 160b of the chip formation wafer 160 is in a state of having the transformation layer 150 thereon, and thus has minute unevenness. Therefore, in the case where the optical semiconductor element is formed as the semiconductor element, the second surface 160b of the chip formation wafer 160 may not be polished and the unevenness of the transformation layer 150 may be used.

Further, in each of the embodiments described above, the through hole 20 may be formed in a part of the semiconductor chip 1 constituting the semiconductor element.

Further, in the second embodiment, the metal film 21 formed in the through hole 20 may not be formed so as to connect the source electrode 16 and the back surface electrode 18. Even in such a semiconductor chip 1, the heat dissipation can be improved as the metal film 21 is formed in the through hole 20.

What is claimed is:

1. A semiconductor chip comprising:
    a chip constituent substrate having a first surface and a second surface opposite to the first surface, the chip constituent substrate including a gallium nitride substrate adjacent to the second surface and a layer containing gallium nitride adjacent to the first surface, the chip constituent substrate provided with a semiconductor element, wherein
    the semiconductor element is disposed such that components constituting the semiconductor element are located more in an area adjacent to the first surface than in an area adjacent to the second surface,
    the chip constituent substrate is formed with a plurality of through holes, as gas vent holes,
    each of the through holes penetrates the chip constituent substrate from the first surface to the second surface and defines a first opening adjacent to the first surface and a second opening adjacent to the second surface,
    the first opening is larger than the second opening, and
    a density of the through holes is 100/cm$^2$ or more.

2. The semiconductor chip according to claim 1, further comprising:
    a metal film provided in each of the through holes.

3. The semiconductor chip according to claim 2, further comprising:
    a first surface electrode disposed on the first surface of the chip constituent substrate; and
    a second surface electrode disposed on the second surface of the chip constituent substrate, wherein
    the metal film is disposed, as a through electrode, to connect the first surface electrode and the second surface electrode.

4. The semiconductor chip according to claim 1, wherein
    each of the through holes is located at a position different from the components constituting the semiconductor element in the chip constituent substrate.

5. The semiconductor chip according to claim 1, wherein
    at least one of the first opening or the second opening of each of the through holes has a circular shape.

6. The semiconductor chip according to claim 1, wherein the density of the through holes is 200/cm$^2$ or more.

7. The semiconductor chip according to claim 1, wherein the density of the through holes is 250/cm$^2$ or more.

8. A method for manufacturing a semiconductor chip having a semiconductor element, the method comprising:
- preparing a gallium nitride wafer which is made of gallium nitride;
- producing a processed wafer by forming an epitaxial film on a surface of the gallium nitride wafer, the processed wafer having a first surface on a side of the epitaxial film and a second surface on a side of the gallium nitride wafer, the processed wafer including a plurality of chip formation regions adjacent to the first surface;
- forming a first surface-side element component of the semiconductor element in each of the plurality of chip formation regions;
- forming a transformation layer, in which nitride is separated from gallium, along a planar direction of the processed wafer by irradiating an inside of the processed wafer with a laser beam from the second surface side of the processed wafer;
- dividing the processed wafer at the transformation layer as a boundary into a chip formation wafer including the first surface of the processed wafer and a recycle wafer including the second surface of the processed wafer;
- extracting the semiconductor chip from the chip formation wafer; and
- before the forming of the transformation layer, forming a gas vent hole in each of the plurality of chip formation regions, the gas vent hole defining an opening adjacent to the first surface of the processed wafer, wherein
- in the forming of the transformation layer, the transformation layer is formed so as to connect to or intersect with the gas vent hole.

9. The method according to claim 8, further comprising:
- after the forming of the gas vent hole, arranging a metal film on the gas vent hole.

* * * * *